(12) United States Patent
Larson et al.

(10) Patent No.: US 6,804,620 B1
(45) Date of Patent: Oct. 12, 2004

(54) CALIBRATION METHOD FOR SYSTEM PERFORMANCE VALIDATION OF AUTOMATIC TEST EQUIPMENT

(75) Inventors: Douglas Larson, Santa Clara, CA (US); Anthony Le, Santa Clara, CA (US); Carol Qiao Tong, Santa Clara, CA (US); Rochit Rajsuman, Santa Clara, CA (US)

(73) Assignee: Advantest Corporation, Gunma (JP)

( * ) Notice: Subject to any disclaimer, the term of this patent is extended or adjusted under 35 U.S.C. 154(b) by 0 days.

(21) Appl. No.: 10/393,876

(22) Filed: Mar. 21, 2003

(51) Int. Cl.[7] .............................. G06F 9/00; G01R 31/02
(52) U.S. Cl. .......................................... 702/91; 324/763
(58) Field of Search .............................. 702/64, 65, 90, 702/91; 324/763; 438/14, 17; 714/724

(56) References Cited

U.S. PATENT DOCUMENTS 4,651,088 A * 3/1987 Sawada ...................... 714/724
6,008,683 A * 12/1999 Gillette ....................... 327/404

* cited by examiner

*Primary Examiner*—John Barlow
*Assistant Examiner*—Meagan S Walling
(74) *Attorney, Agent, or Firm*—Morrison & Foerster LLP

(57) ABSTRACT

An ATE calibration method and system that does not require external test equipment to calibrate individual functional pins and provides balanced timing skews among the functional pins and pincards is disclosed. A functional pin in the test system is selected as a reference or "golden" pin and another is selected as a precision measurement unit (PMU). External test equipment and the reference PMU are used to measure the AC and DC characteristics of the reference pin, and any deviation represents a measurement error in the reference PMU. All functional pins in the test system can be measured against the reference pin using the reference PMU, taking into account the measurement error, without the need for external test equipment. To ensure that skews are balanced among all pins, the location of the reference pin is selected to be as close as possible to the midpoint of the functional pin range.

36 Claims, 17 Drawing Sheets

```
function pmuVS ( volts, range )
{
    dacValue = int ( ( volts * 500 ) + 4096 )  // Analog to digital (in decimal) conversion
                                               // for a 13-bit register. 4096 (13'h1000)
                                               // is the base (corresponding to 0 volt), and
                                               // the voltage offset is 12 bits.

If ( dacValue > 7846 )   // Limit to +7.5 (digital decimal 7846) volts
    {
        dacValue = 7846
    } if ( dacValue < 2346 )          // Limit to -3.5 (digital decimal 2346) volts
    {
        dacValue = 2346
    }

PmuCntl.write( 0x3 & range )   // VSIM mode : bit value 0x4 = 0
    Vinp.write( dacValue )
}
```

```
if ( ( ( PmuData.read() ) & 0x6 ) == 0x6 )
    pass = TRUE
else
    pass = FALSE
```

FIG. 6

CALIBRATION METHOD FOR SYSTEM PERFORMANCE VALIDATION OF AUTOMATIC TEST EQUIPMENT

CROSS-REFERENCE TO RELATED APPLICATIONS

This application is related to U.S. utility application Ser. No. 10/340,349 entitled "Semiconductor Test System Storing Pin Calibration Data In Non-Volatile Memory," filed Jan. 10, 2003, the contents of which are incorporated herein by reference for all purposes.

FIELD OF THE INVENTION

This invention relates to a semiconductor test system for testing semiconductor devices such as integrated circuits (ICs), and more particularly, to calibrating individual tester pins in a semiconductor test system without the need for external test equipment.

BACKGROUND OF THE INVENTION

In testing semiconductor devices such as ICs using a test system such as an IC tester, test systems such as automatic test equipment (ATE) provide the device under test (DUT) with test signals or test patterns at specific functional test pins. The test signals are transmitted to the DUT using drivers which may generate the test signals at a selectable amplitude, impedance, current, slew rate, and the like. The test system receives output signals from the DUT in response to the test signals, and the output signals are strobed or sampled by analog comparators upon receipt of strobe signals generated at predetermined time intervals. The captured output data is compared with expected output data to determine whether the DUT is functioning correctly.

FIG. 1 illustrates an exemplary test system environment 100. Test vectors from pin unit 102 on pincard 104 may need to pass through a driver 106, cabling 108, functional "pogo pins" 110, traces 112 on loadboard 114, socket 116, and finally into DUT 118. Output signals must return to the pincard 104 through a similar path, except that the output signals would pass through one or more comparators 120 rather than a driver 106. The driver 106 and comparator 120 are typically assembled in blocks known as pin units or pin electronics 122.

As supplied from pincard vendors, each pincard 104 installed into the test system 100 is identical in design. However, the installed pincards 104 reside in different slots within the test system 100 and therefore have unique physical signal paths. Lengthy signal paths may contain parasitic resistances and capacitances (RCs) which can slow down the propagation of the signals and rise and fall times. Moreover, although the signal paths through each pin unit 102 on each pincard 104 utilize the same circuit designs and part types, part-to-part variations may also introduce differences in propagation delays, voltage and current levels, and rise and fall times. Because testing of the DUT can require precise control of the alternating current (AC) and direct current (DC) characteristics of input test signals and precise measurement of output signal timing and parametrics, test signals and output signals in the pin units 102 need to be calibrated to account for measurement error and signal degradation, thereby ensuring accurate measurements.

Calibration data can be thought of as compensation data used to adjust the measurement or stimulus of a device to provide the most accurate results. Calibration data can be used in several ways. For example, it can be a hardware correction register parameter or an adjustment parameter used to correct a measured result. Calibration data may be needed in a test system on a per-pin basis to compensate for reference driving voltages, reference comparison voltages, driving current loads, parametric measurement circuits connected to the test pins, timing strobes used to trigger comparisons, timing triggers used to drive test pin stimulus, and the like.

Traditionally, calibration of functional test pins has been performed using test equipment external to the test system such as oscilloscopes, voltmeters, current meters, and the like. These traditional methods can be very time consuming. The compensation data is obtained when each tester pin is measured for all DC and AC characteristics. For DC measurements, the test equipment needs to have Voltage Source, Current Measure (VSIM) and Current Source, Voltage Measure (ISVM) capabilities. This method provides DC measurements with an error factor associated with the error of the measuring equipment. For AC measurements (i.e., timing related characteristics such as edge placement, waveform rise time, and waveform fall time), a high-speed oscilloscope may be used. For these measurements as well, the error factor is the error of the measuring instrument. One limitation of external measuring instruments is that they are typically controlled by General Purpose Interface Bus (GPIB) protocols that have a slow response time. Because all measurements are taken by external test equipment via a GPIB, the large number of tester pins on current ATE systems results in a very time consuming process to obtain all measurement data and to compute compensation values whenever and wherever compensation is needed.

Therefore, a need exists for an ATE calibration method that does not require external test equipment to calibrate individual tester pins, and provides balanced timing skews among the pincards.

SUMMARY OF THE INVENTION

Embodiments of the present invention are directed to an ATE calibration method and system that does not require external test equipment to calibrate individual functional pins and provides balanced timing skews among the functional pins and pincards.

A test system environment generally applicable to embodiments of the present invention includes multiple pincards, each pincard coupled to a DUT interface such as a loadboard via cabling. The pincards are also connected to test system components common to the pincards such as a tester controller through a tester bus on a backplane. Each pincard may have multiple functional pins and one or more precision measurement units (PMUs). PMUs may be shared between two or more functional pins, or dedicated to a single functional pin. The PMUs on all pincards in a test system together comprise a universal DC unit (UDC) (a.k.a. central measurement unit or central DC reference unit). In embodiments of the present invention, the UDC can also function as a distributed measurement circuit capable of making DC measurements on tester pins themselves and thus can act as a substitute for external test equipment. The UDC is connected to functional pins for measuring a DUT when the test system is in a normal test (not calibration) mode.

Embodiments of the present invention assign at least one functional pin in the test system as a reference or "golden" pin specifically for calibration purposes. In addition, one PMU is assigned as the reference PMU. In one implementation, the reference PMU is located on the same pincard as the reference pin. Alternatively, it can be located on the backplane or on another pincard. Because reference pin is selected from among the functional test pins, the reference pin has the same characteristics as any other functional test pin. However, once a functional pin is designated as a reference pin, in preferred embodiments that pin is prohibited from being used as a functional pin. However, in alternative embodiments, the reference pin may be used as a functional pin.

Once the reference pin and reference PMU have been designated, external test equipment is used to measure the AC and DC characteristics of the reference pin. The reference PMU is also used to measure the AC and DC characteristics of the reference pin. Note that it is possible to measure and store data on the reference pin for two different operational modes. Because the test equipment reference pin measurements become the standard against which all functional pins and PMUs are measured, the tester controller compares the reference PMU reference pin measurements to the test equipment reference pin measurements. Any deviation represents an error in the reference PMU that is taken into account when measuring and calibrating functional pins using the reference PMU. Once the parameters and characteristics of the reference pin and reference PMU are determined, all other functional pins in the test system can be connected to and measured against the reference pin using the reference PMU, without the need for external test equipment.

Each functional pin and reference pin contains driver and comparator circuitry. To measure the output driver characteristics of a functional pin, switches are configured to couple the comparators of the reference pin to the driver of the functional pin. No DUT is connected at this time. The reference PMU then makes DC measurements of the functional pin driver. These DC measurements may then be offset by any known reference PMU errors. Similarly, to measure the input comparator characteristics (e.g. input voltage and current levels) of the functional pin, switches are configured to couple the driver of the reference pin to the comparators of the functional pin. The reference PMU then makes DC measurements of the functional pin comparators, again offset by any known reference PMU errors. The use of a reference pin and a calibrated reference PMU as a measurement tool eliminates the need to measure individual functional pin parameters using external test equipment, thereby reducing the overall calibration time. By comparing the measured reference pin data to the measured functional pin data, calibration data can be determined for each of the functional pins.

To ensure that skews are balanced among all pins to the greatest extent possible, in one embodiments of the present invention the location of the reference pin is selected to be as close as possible to the midpoint of the functional pin range. However, even though the reference pin may be assigned a midpoint location, the large difference in skews may nevertheless be difficult to compensate. Therefore, in another embodiment of the present invention, more than one reference pin could be designated to limit the variations in skews. Based on the stored calibration data for the functional pins, the tester controller can determine how many reference pins are needed, and where to assign them to limit the maximum skew in the test system.

Embodiments of the present invention employ nonvolatile memory such as flash memory in each pincard and optionally in the backplane to store the calibration data. This non-volatile memory resides locally on each pincard, and thus if a pincard is removed from the system or a power interruption occurs, the calibration data is not lost.

BRIEF DESCRIPTION OF THE DRAWINGS

FIG. 6 illustrates an example program file of a PMU measurement according to embodiments of the present invention.

DETAILED DESCRIPTION OF THE PREFERRED EMBODIMENT

In the following description of preferred embodiments, reference is made to the accompanying drawings, which form a part hereof, and in which is shown by way of illustration specific embodiments in which the invention may be practiced. It is to be understood that other embodiments may be utilized and structural changes may be made without departing from the scope of the preferred embodiments of the present invention.

System environment. Embodiments of the present invention are directed to an ATE calibration method and system that does not require external test equipment to calibrate individual functional pins and provides balanced timing skews among the functional pins and pincards.

Figure 1:
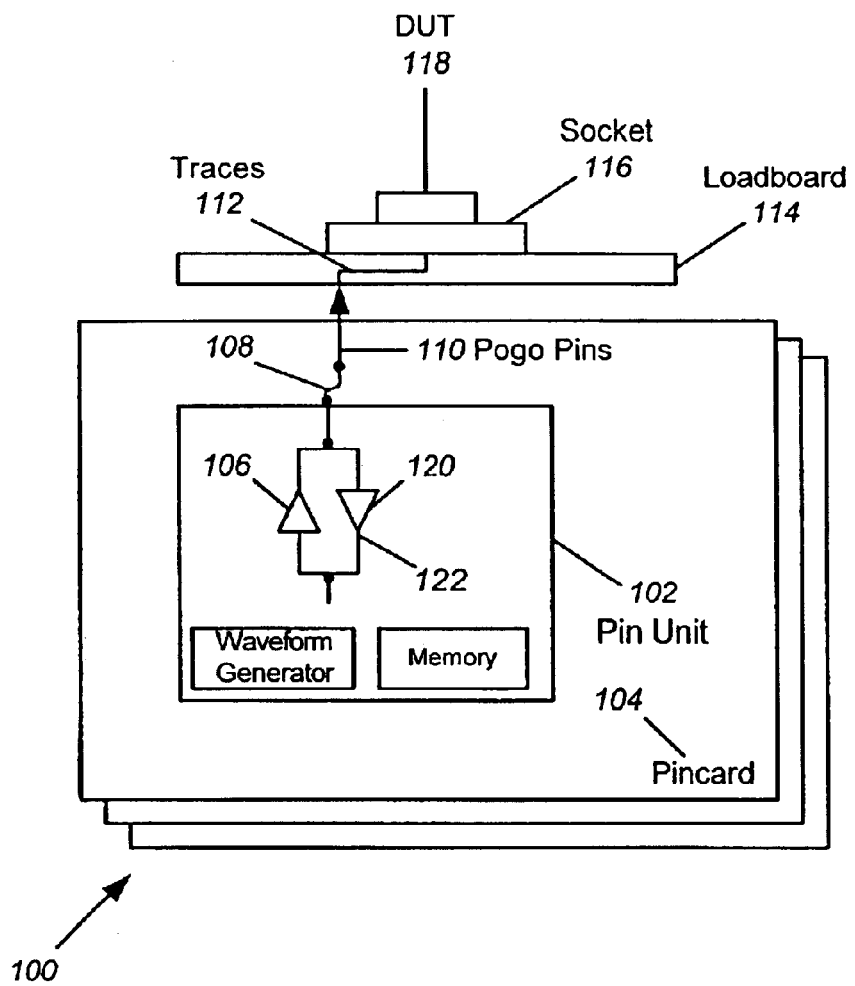
FIG. 1 illustrates an exemplary test system environment.
Figure 2:
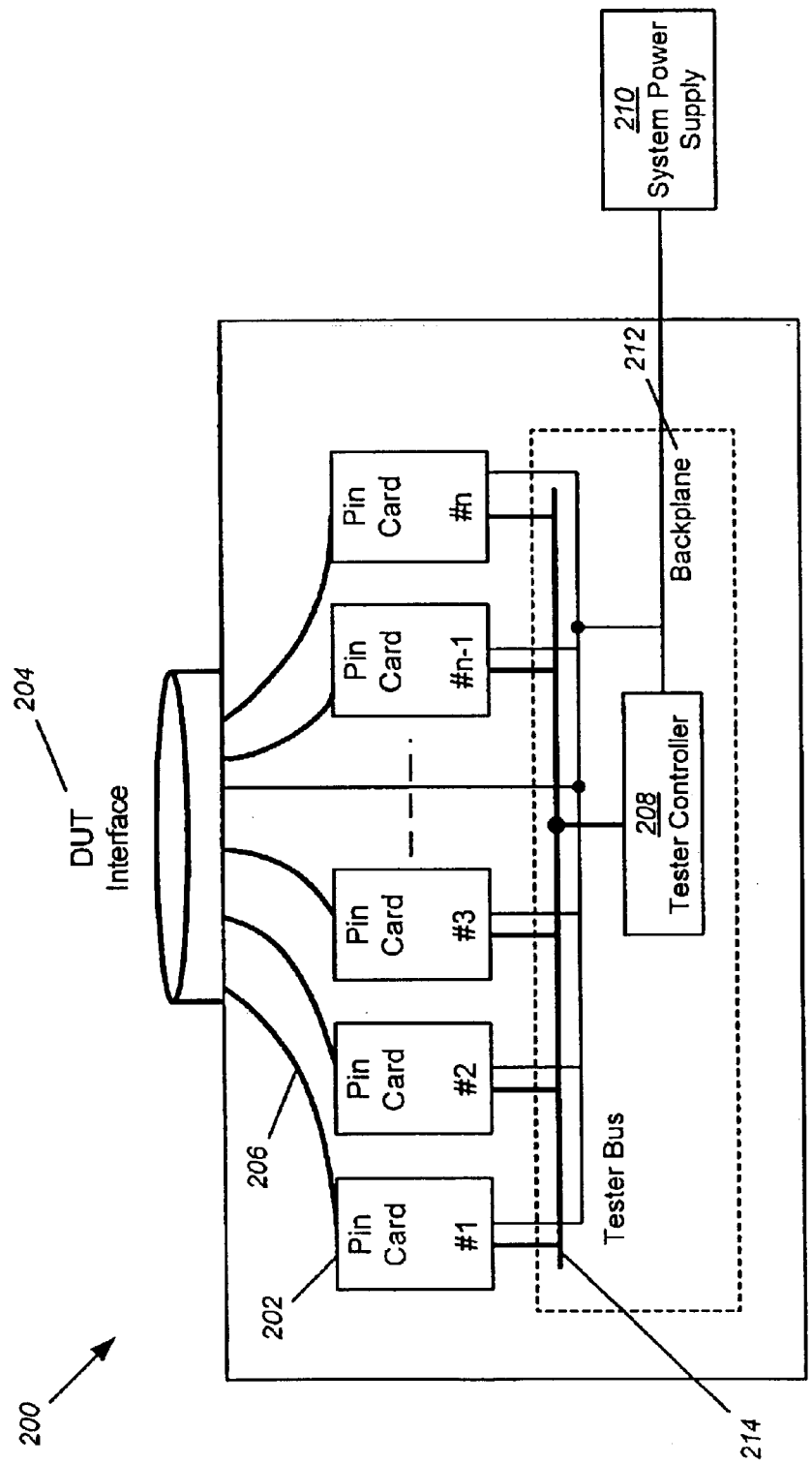
FIG. 2 illustrates an exemplary test system environment generally applicable to embodiments of the present invention.

FIG. 2 illustrates an exemplary test system environment 200 generally applicable to embodiments of the present invention. The test system includes multiple pincards 202, each pincard coupled to a DUT interface 204 such as a loadboard via cabling 206. The pincards 202 are also connected to test system components common to the pincards such as a tester controller 208 through a tester bus 214 on a backplane 212. Note that although FIG. 2 shows the tester controller 208 located on the backplane 212, in embodiments of the present invention the tester controller may be located on the backplane or physically separated from the backplane. Other test system components common to the pincards include power supply 210 and other devices well understood by those skilled in the art.

Figure 3:
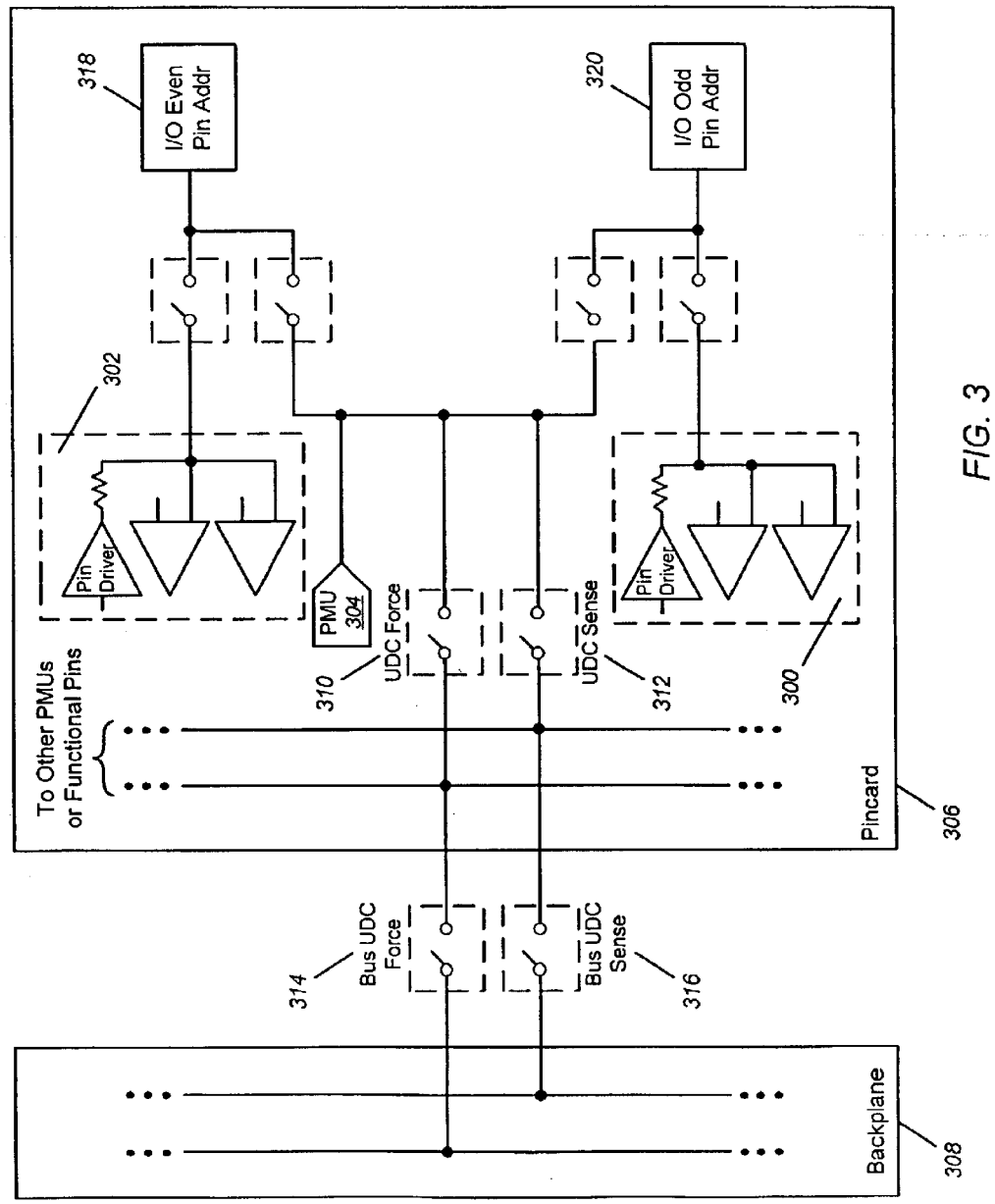
FIG. 3 illustrates exemplary connection paths between functional pins and a precision measurement unit (PMU) on a pincard and a backplane according to embodiments of the present invention.

FIG. 3 illustrates exemplary connection paths between functional pins 300 and 302 and a precision measurement unit (PMU) 304 on a pincard 306 and a backplane 308 according to embodiments of the present invention. It should be understood that although only two representative functional pins and one PMU are shown in FIG. 3, there are multiple functional pins and one or more PMUs 304 on a pincard 306. PMUs may be shared between two or more functional pins, or dedicated to a single functional pin. The PMUs 304 on all pincards 306 in a test system together comprise a universal DC unit (UDC) (a.k.a. central measurement unit or central DC reference unit). The UDC can function as a distributed measurement circuit capable of making DC measurements that acts as a substitute for external test equipment. The UDC can be configured to function like and replace a voltmeter, current meter, or other external test equipment. Thus, the UDC has the same capability as external test equipment to perform VSIM and ISVM functions. In addition, the UDC may also be connected to functional pins for measuring a DUT when the test system is in a normal test (not calibration) mode.

Functional pins 300 and 302 and PMU 304 may all be connected to the backplane 308 via UDC force switch 310 and UDC sense switch 312, which are preferably located on the pincard 306, and via bus UDC force switch 314 and bus UDC sense switch 316, which may be located either on the pincard 306 or backplane 308. Note that the I/O Even Pin Addr and I/O Odd Pin Addr blocks 318 and 320, respectively, are addressing blocks that are needed only when a PMU needs to be mapped to more than one functional pin. For example, if there are eight functional pins for every PMU, then an address is needed to specify which functional pin is being connected to the PMU at any time.

Designation of reference pin and reference PMU. Embodiments of the present invention assign at least one functional pin in the test system as a reference or "golden" pin specifically for calibration purposes. In addition, one PMU is assigned as the reference PMU. In a preferred embodiment, the reference PMU is located on the same pincard as the reference pin. For purposes of discussion, assume that functional pin 302 and PMU 304 in the example of FIG. 3 are assigned as the reference pin and the reference PMU for the entire test system. Because reference pin 302 is selected from among the functional test pins, the reference pin 302 has the same characteristics as any other functional test pin. However, once a functional pin is assigned as a reference pin, in preferred embodiments that pin is prohibited from being used as a functional pin. However, in alternative embodiments, the reference pin may be used as a functional pin.

Reference pin and reference PMU measurement. Once the reference pin and reference PMU have been assigned, external test equipment is used to measure the reference pin and reference PMU so that the characteristics of the reference pin and reference PMU are established. First, the performance of the reference pin is measured using external test equipment such as a voltmeter and current meter for DC measurements, and a high-speed oscilloscope for AC measurements.

Figure 4:
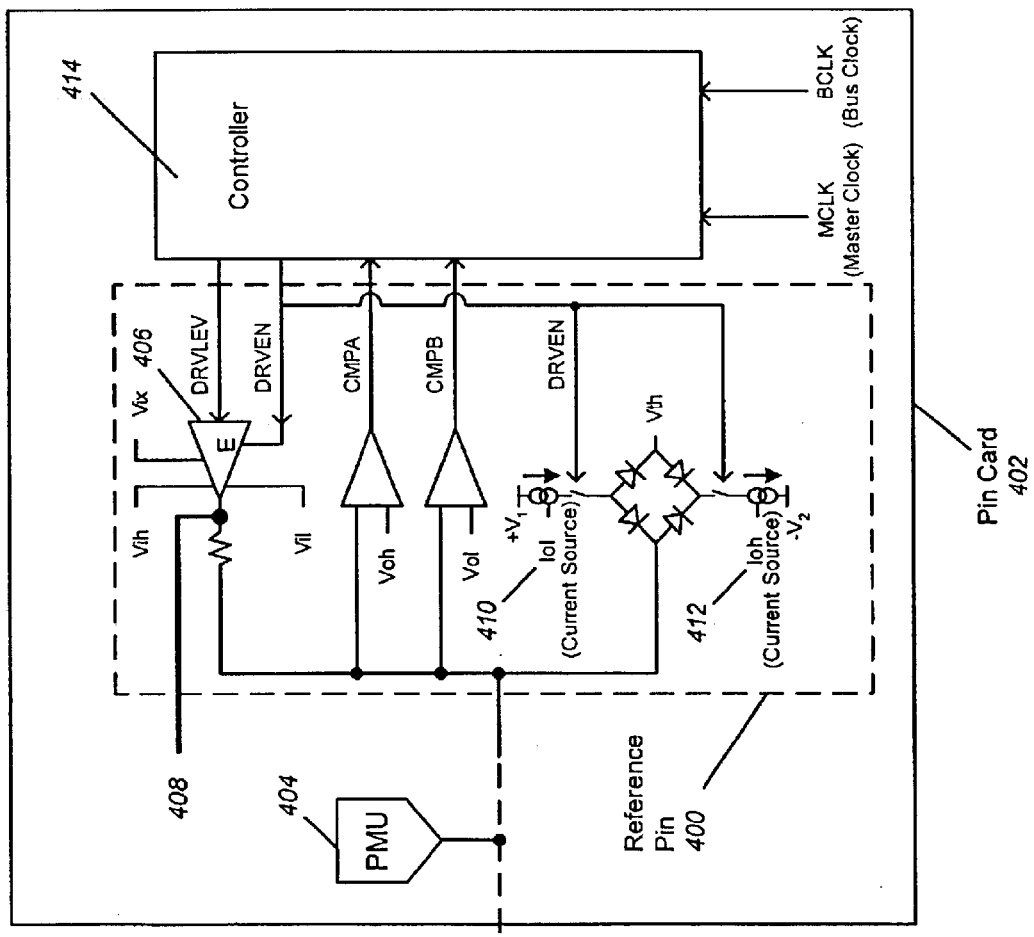
FIG. 4 is an exemplary circuit diagram illustrating the DC and AC measurements of a reference pin on a pincard according to embodiments of the present invention.

FIG. 4 is an exemplary circuit diagram illustrating the DC and AC measurements of a reference pin 400 on pincard 402 according to embodiments of the present invention. In the example of FIG. 4, reference pin driver measurements are obtained by connecting voltmeter or oscilloscope test probes to the output 408 of the reference pin driver 406, and connecting current probes into the supply lines 410 or 412 of the pincard power supply. The output 408 of the reference pin driver may not be connected to the DUT or any functional pin at this time, so no-load measurements may be taken. In an alternative embodiment, an impedance load may be added to the output of the reference pin driver and an impedance load measurement may be taken. The reference pin driver 406 may be controlled by local pincard controller 414 to generate either a high or low voltage output for the purpose of taking DC voltage and current measurements. The local pincard controller 414 also controls the reference pin driver 406 to generate a switching output for the purpose of taking AC measurements. Note that oscilloscopes may be used to take AC measurements such as rise and fall times. Alternatively, multiple DC measurements (e.g. voltages) may be taken at discrete time intervals, and a computation on those measurements may be performed to derive the rise and fall times. The reference pin driver measurements taken by the external test equipment may then be stored in test system memory under the control of the tester controller. In addition, DC and AC measurements are also taken on the reference pin input comparators. Note that it is possible to measure and store data on the reference pin for two different operational modes. For purposes of discussion, the stored external test equipment measurements of the reference pin may be referred to generally herein as:

$$R\_PIN_{EXT}.$$

In embodiments of the present invention, either while the reference pin is being measured using external test equipment or at a different time, reference PMU 404, which is a device well understood by those skilled in the art, also takes DC measurements of the reference pin driver and comparators. These measurements may also be stored in test system memory under the control of the tester controller. Note that the reference PMU 404 is able to take AC measurements by making repeated DC measurements. For example, rise and fall times may be obtained by taking repeated DC measurements of an output waveform, determining the 10% and 90% voltage levels, and performing some computations. For purposes of discussion, the stored reference PMU measurements of the reference pin may be referred to generally herein as:

$$R\_PIN_{PMU}.$$

Figure 5:
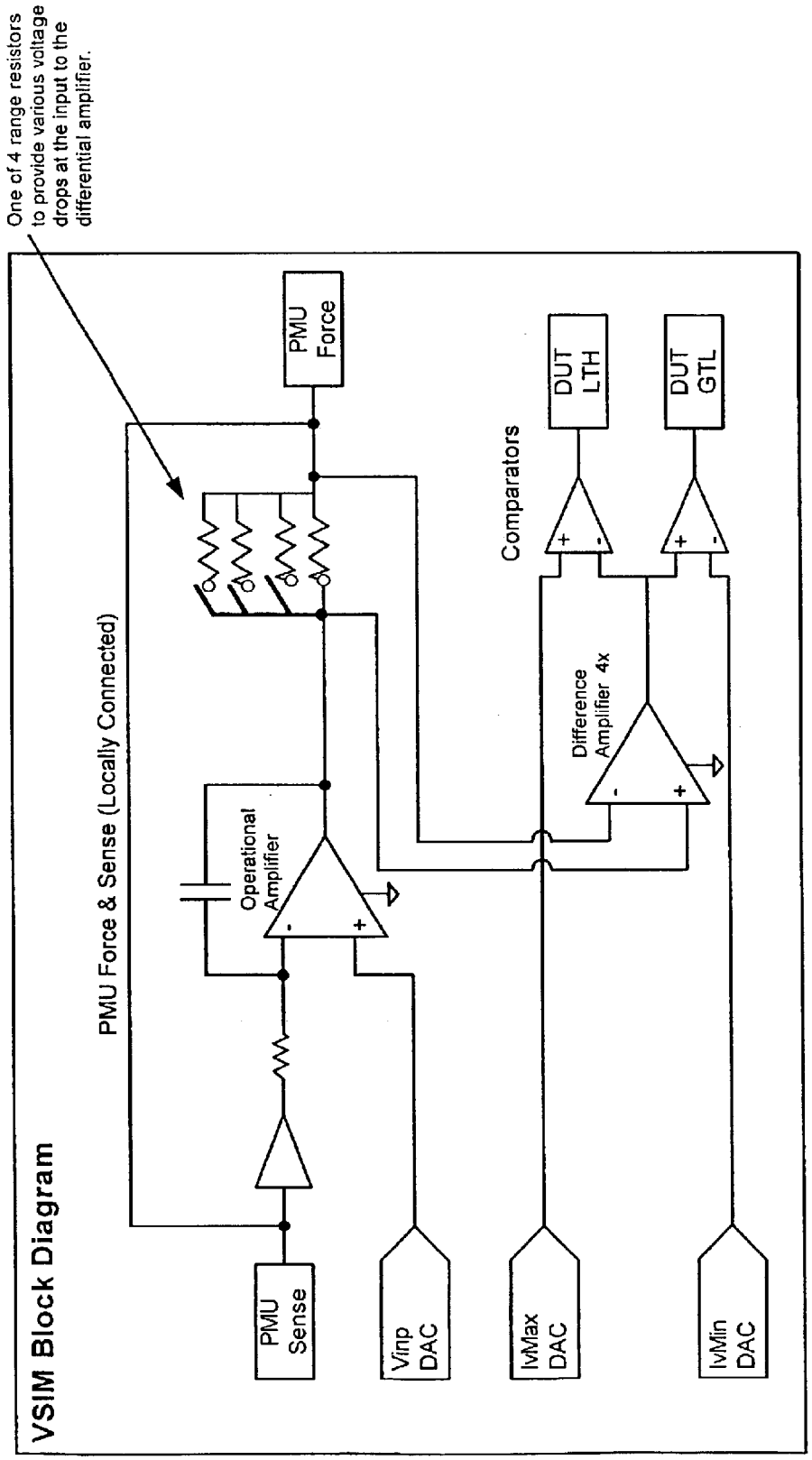
FIG. 5 illustrates an example circuit diagram of a PMU configured for a VSIM measurement according to embodiments of the present invention.

An example circuit diagram of a PMU configured for a VSIM measurement is illustrated in FIG. 5. The tester controller activates and deactivates the PMUs to test the functional pins on the pincards and obtain measurements (e.g. current, voltage) for each functional pin.

An example program file of a PMU measurement routine is shown in FIG. 6, while an example set of calibration data derived from measured data is shown in Table 1 below.

TABLE 1

Example calibration data derived from measured data

|  | pmVINP | pmIVIN | PMIVMAX | PMIVMIN |
| --- | --- | --- | --- | --- |
| Gain adjustment (% deviation from nominal (1.0)) | | | | |
| Min | −0.1953 | 0.1953 | −0.4028 | −0.2075 |
| Max | 0.5127 | 2.0996 | 0.5371 | 0.6348 |
| Average | 0.1734 | 1.2993 | 0.1835 | 0.2010 |
| Offset adjustment (mV) | | | | |
| Min | −36.00 | −50.00 | −46.00 | −52.00 |
| Max | 142.00 | 62.33 | 38.00 | 50.00 |
| Average | 14.28 | 2.35 | −4.16 | 4.82 |

Table 1. Example Calibration Data Derived from Measured Data

Note that the example calibration data in Table 1 was derived from the measurement of multiple pins. The Min and Max rows indicate the range of the data for various PMU parameters, while the Average row gives the average calibration value derived from the measurement of all pins. In the example of Table 1, the four DC measurements pmVINP, pmIVIN, pmIVMAX, and pmIVMIN represent the four DC levels for PMUs, and each DC measurement includes a gain register (a multiplication factor) and an offset register (a shift) for calibration. Note that pmVINP=the input voltage for a PMU, pmIVIN=the input current for a PMU, pmIVMAX=the voltage input of an upper comparator of a PMU, and pmIVMIN=the voltage input of the lower comparator of a PMU.

Because the test equipment reference pin measurements become the standard against which all functional pins and PMUs are measured, the tester controller compares the reference PMU reference pin measurements to the test equipment reference pin measurements. Any deviation represents an error in the reference PMU that is taken into account when measuring and calibrating functional pins using the reference PMU. These deviations may also be stored in test system memory under the control of the tester controller. For example, if the external test equipment measures the output low voltage (Vol) of the reference pin as 0.1 volts, but the reference PMU measures Vol of the reference pin as 0.0 volts, it will be assumed that all output low voltage measurements taken by the reference PMU will be −0.1 volt in error (i.e. +0.1 volts must be added to any reference PMU Vol measurement). For purposes of discussion, the deviation between the stored reference PMU measurement on the reference pin and the stored external test equipment measurement on the reference pin may be computed and referred to generally herein as:

$$PMUERR = R\_PIN_{PMU} - R\_PIN_{EXT}.$$

Functional pin measurement. Once the parameters and characteristics of the reference pin and reference PMU are determined, all other functional pins in the test system can be connected to and measured against the reference pin using the reference PMU, without the need for external test equipment.

Figure 7:
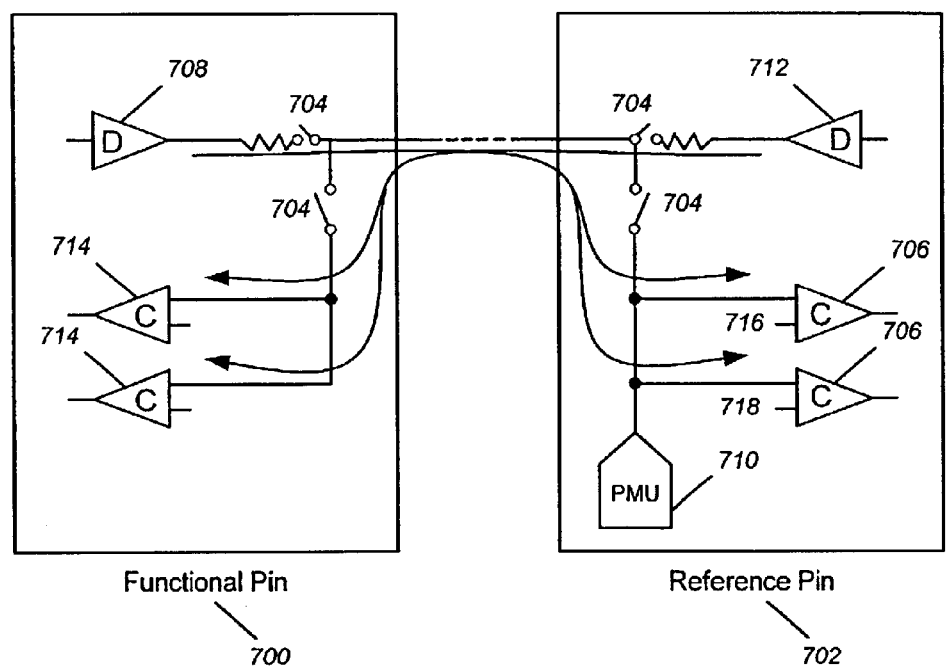
FIG. 7 illustrates a simplified exemplary diagram of the connection between functional and reference pins during measurement of the functional pins according to embodiments of the present invention.

FIG. 7 illustrates a simplified exemplary diagram of the connection between functional 700 and reference pins 702 during calibration of the functional pins according to embodiments of the present invention. As shown in FIG. 7, each functional pin and reference pin contains driver and comparator circuitry. To measure the output driver characteristics of a functional pin 700, switches 704 are configured to couple the comparators 706 of the reference pin 702 to the driver 708 of the functional pin 700. No DUT is connected at this time. The reference PMU 710 then makes DC measurements of the functional pin driver 708, which may be stored in test system memory. These DC measurements may then be offset by any known reference PMU errors, and the results stored in test system memory. Similarly, to measure the input comparator characteristics (e.g. input voltage and current levels) of the functional pin 700, switches 704 are configured to couple the driver 712 of the reference pin 702 to the comparators 714 of the functional pin 700. The reference PMU 710 then makes DC measurements of the functional pin comparators 714, offset by any known reference PMU errors.

Figure 8:
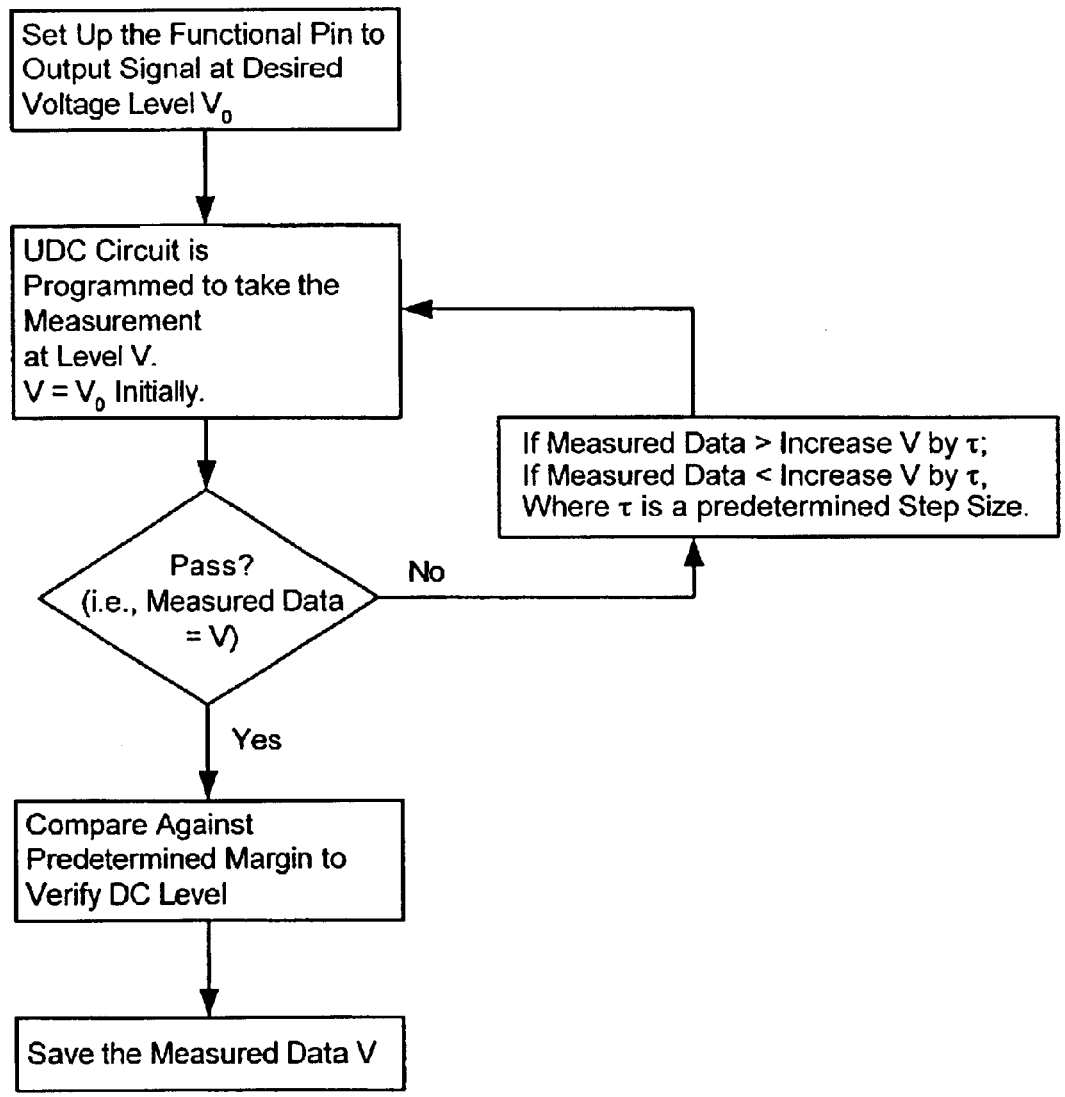
FIG. 8 is a flowchart illustrating the basic DC measurement procedure of a functional pin by a PMU according to embodiments of the present invention.

FIG. 8 is a flowchart illustrating the basic DC measurement procedure of a functional pin by a PMU according to embodiments of the present invention.

Note that although functional and reference pins with two comparators are shown in FIG. 7, two comparators are not necessary in embodiments of the present invention. For example, if two comparators are employed, reference voltages set up at the reference pin comparators (see inputs 716 and 718 in FIG. 7) under the control of the tester controller establish an expected voltage window. When a voltage to be measured is applied to the other two inputs of the comparators, the outputs of the comparators provide an indication of whether the voltage is within the window, higher, or lower than the window. However, voltage ranges (e.g. above or below a certain threshold) may also be measured with only one comparator. It should be understood that although the reference PMU 710 can be used to measure voltages, in preferred embodiments the comparators are used because the comparators enable voltage measurements to be taken more efficiently. For example, the repeated reference PMU measurements needed to obtain rise and fall times can be minimized using the comparators.

For purposes of discussion, the stored reference PMU measurements on functional pin X, offset by any known reference PMU error, may be computed and referred to generally herein as:

$$F\_PIN\_X_{PMU\_CORR} = F\_PIN\_X_{PMU} - PMUERR,$$

where $F\_PIN\_X_{PMU}$ represents the stored reference PMU measurements on functional pin X prior to correction with the known reference PMU error.

Figure 9:
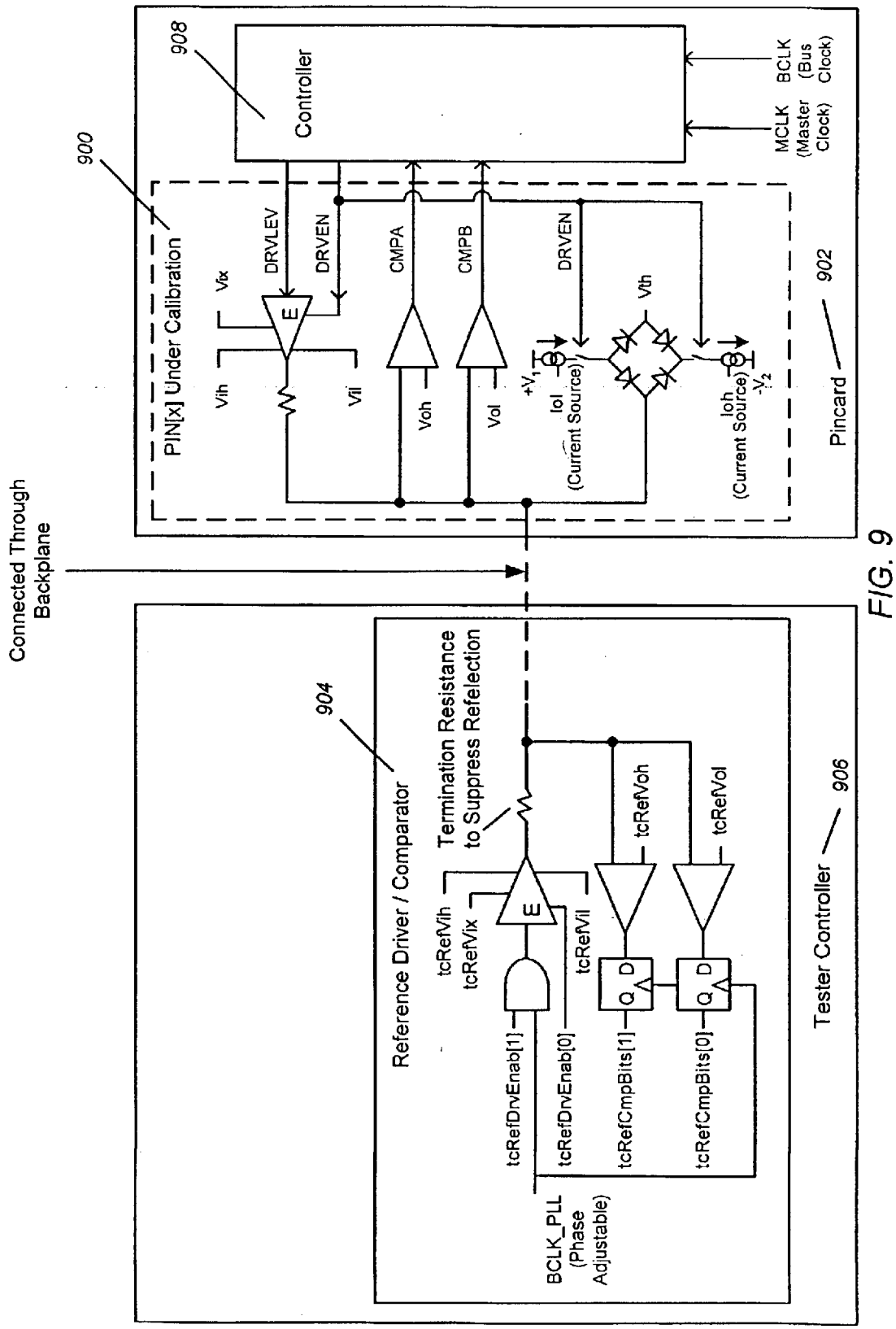
FIG. 9 illustrates a more detailed exemplary diagram of the connection between a functional pin on pincard and a reference pin on pincard through a backplane during measurement of the functional pins according to embodiments of the present invention.

FIG. 9 illustrates a more detailed exemplary diagram of the connection between a functional pin 900 on pincard 902 and a reference pin 904 on pincard 906 through a backplane during measurement of the functional pins according to embodiments of the present invention. It should be understood that reference pin 904 may also be used to calibrate a functional pin 900 located on the same pincard. Even in this configuration, the reference pin 904 and functional pin 900 are connected through the backplane. Each pincard includes a local controller 908 which controls which functional pins are active on that pincard and, for each active functional pin, either controls the application of signals to the driver of the functional pin or controls the sensing of signals received by the comparators of the functional pin.

Figure 10:
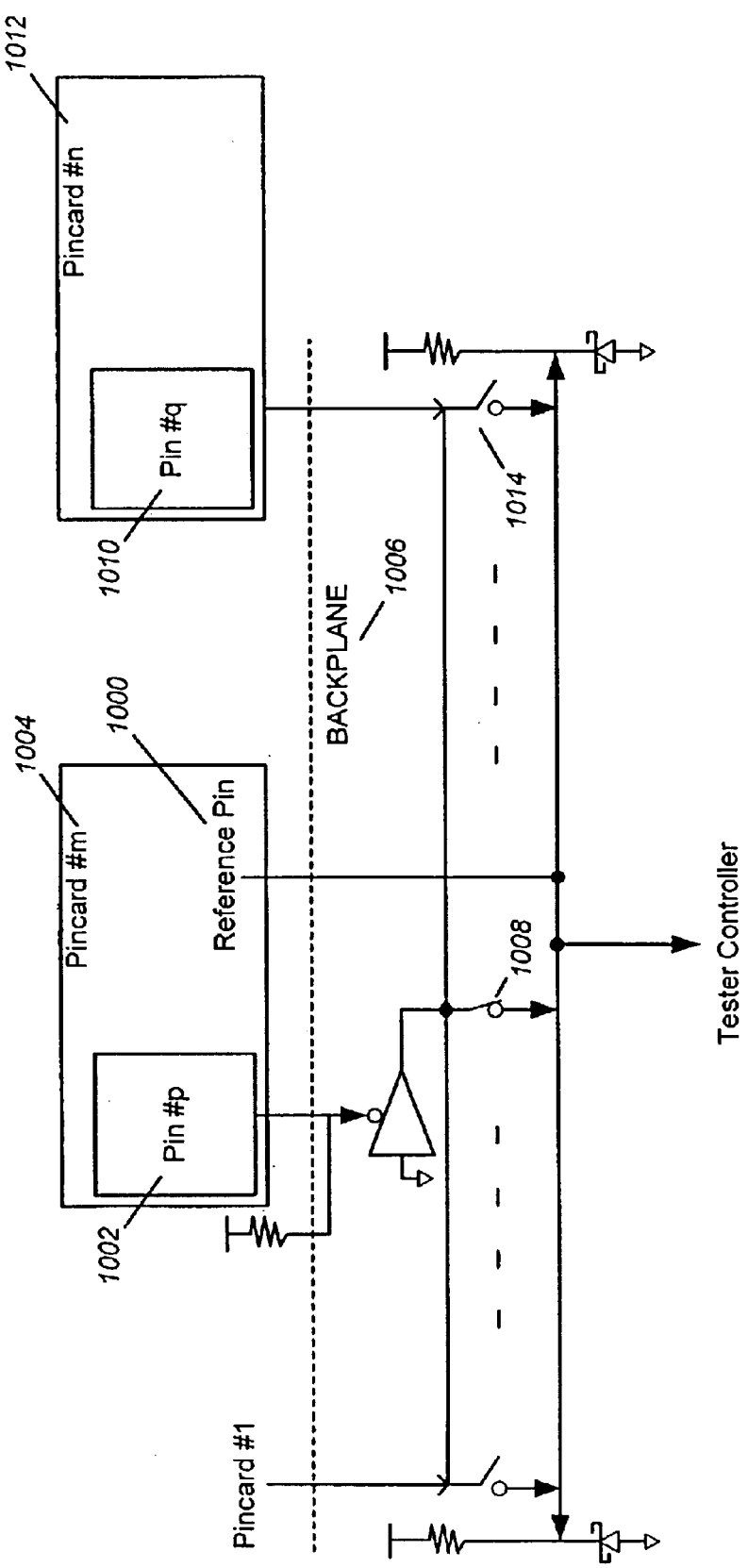
FIG. 10 illustrates an example of the connectivity between a reference pin and (1) a functional pin on the same pincard as the reference pin, and (2) a functional pin on a pincard different from the reference pin pincard via a system backplane according to embodiments of the present invention.

FIG. 10 illustrates an example of the connectivity between a reference pin 1000 and a functional pin 1002 on the same pincard 1004 via switch 1008 and system backplane 1006 according to embodiments of the present invention. Note also that a functional pin 1010 on a pincard 1012 different from the reference pin pincard 1004 may also be connected to the reference pin 1000 via switch 1014 and system backplane 1006 according to embodiments of the present invention. FIG. 10 illustrates an example of the relays (switches) that enable connections between the functional and reference pins on different pincards to be made, one at a time. Because only one pincard can be calibrated at a time, the bank of switches of FIG. 10 must be controlled so that only those switches corresponding to pincards being tested are closed at any time.

Computation of functional pin calibration data. From the stored measurements described above, calibration data can be determined for each of the functional pins. This calibration data may also be stored in test system memory under the control of the tester controller. For example, if a reference pin driver was measured to have Vol of +0.1 volts, and a functional pin driver was measured by the reference PMU to have Vol of +0.1 volts, but the reference PMU Vol error is −0.1 volts (i.e. +0.1 volts must be added to any reference PMU Vol measurement), then the functional pin driver has an actual Vol of +0.2 volts. The use of a reference pin and a calibrated reference PMU as a measurement tool eliminates the need to measure individual functional pin parameters using external test equipment, thereby reducing the overall calibration time. The calibration data for each functional pin may be provided with the test system on a CD or other persistent storage medium. For purposes of discussion, the stored calibration data for functional pin X may be computed and referred to generally herein as:

$$F\_PIN\_X_{CAL} = F\_PIN\_X_{PMU\_CORR} - R\_PIN_{EXT}.$$

Group write. Embodiments of the present invention employ a group write computation and storage technique which enables the test system to store gain and offset calibration data unique to each functional pin, yet compute and store calibrated test data for multiple functional pins in a single bus cycle, decreasing test time. To achieve this, functional pins are first organized into pin groups (e.g. all pins on a pincard). A group write command is then issued for a particular pin group to set up a pin electronics DC parameter such as Vih (compute and store calibrated test data). Continuing the present example for purposes of illustration only, the raw Vih data for each functional pin that belongs to that pin group is retrieved from storage, multiplied by the stored gain correction for that pin, and the result is added to the stored offset correction for that pin. The end result, which is the calibrated test data, is written to a register. A single group write can therefore set up Vih for all pins in a group, or even all pins in the test system. The net result is that each parameter for each functional pin in the tester is calibrated in accordance with the calibration data for that pin. To perform the calibration computations, only one multiplier and one adder are required per functional pin. The same multiplier and adder may be used to calibrate all parameters for that pin.

Update flags. Embodiments of the present invention also utilize update flags. An update flag comprising one bit is typically assigned to a register for each functional pin. For example, one update flag will be assigned to each of the Vih, Vil, Iih and Iil registers of functional pin A, and one update flag will be assigned to each of the Vih, Vil, Iih and Iil registers of functional pin B. A more complete list of registers associated with a particular functional pin is presented in Table 2.

TABLE 2

Example register list for a functional pin

| Register Name | Description |
| --- | --- |
| Stat1 | Status register for reading group PMU results |
| Vinp | DAC ideal register used to control the PMU force voltage level |
| Ivin | DAC ideal register used to control the PMU force current level |
| IvMax | DAC ideal register for the higher limit threshold of the comparator |
| IvMin | DAC ideal register for the lower limit threshold of the comparator |
| VinpOffs | DAC offset register for the PMU force voltage level |
| IvinOffs | DAC offset register for the PMU force current level |
| IvMaxOffs | DAC offset register for the higher limit threshold of the comparator |
| IvMinOffs | DAC offset register for the lower limit threshold of the comparator |
| VinpGain | DAC gain register for the PMU force voltage level |
| IvinGain | DAC gain register for the PMU force current level |
| IvMaxGain | DAC gain register for the higher limit threshold of the comparator |
| IvMinGain | DAC gain register for the lower limit threshold of the comparator |
| VinpData | DAC data register for the PMU force voltage level |
| IvinData | DAC data register for the PMU force current level |
| IvMaxData | DAC data register for the higher limit threshold of the comparator |
| IvMinData | DAC data register for the lower limit threshold of the comparator |
| DacCntl | DAC Control register |
| RlyCntl | Relay Control register |
| PmuCntl | PMU Control register |
| PmuData | PMU Data register |
| DrvCntl | Pin Drive Control register |
| DacFlag | DAC Data Flag register |

Table 2. Example Register List for a Functional Pin

In the example of Table 2, 23 registers are used to store various values. The registers in Table 2 include the storage registers for both predetermined and measured values, and all the control registers for the operation of PMU calibration.

The update flags for the registers associated with a particular parameter are set when a group write for that parameter occurs, and are cleared only after the appropriate register is updated. For example, a group write to Vih may first cause the update flags for the Vih registers of functional pins A and B to be set. These set update flags will first cause the Vih register of functional pin A to be written to the appropriate register, followed by the Vih register of functional pin B, assuming that both pins belong to the same group. The update flags ensure that all registers are updated, even if group writes to all parameters are issued as fast as possible.

Figure 11:
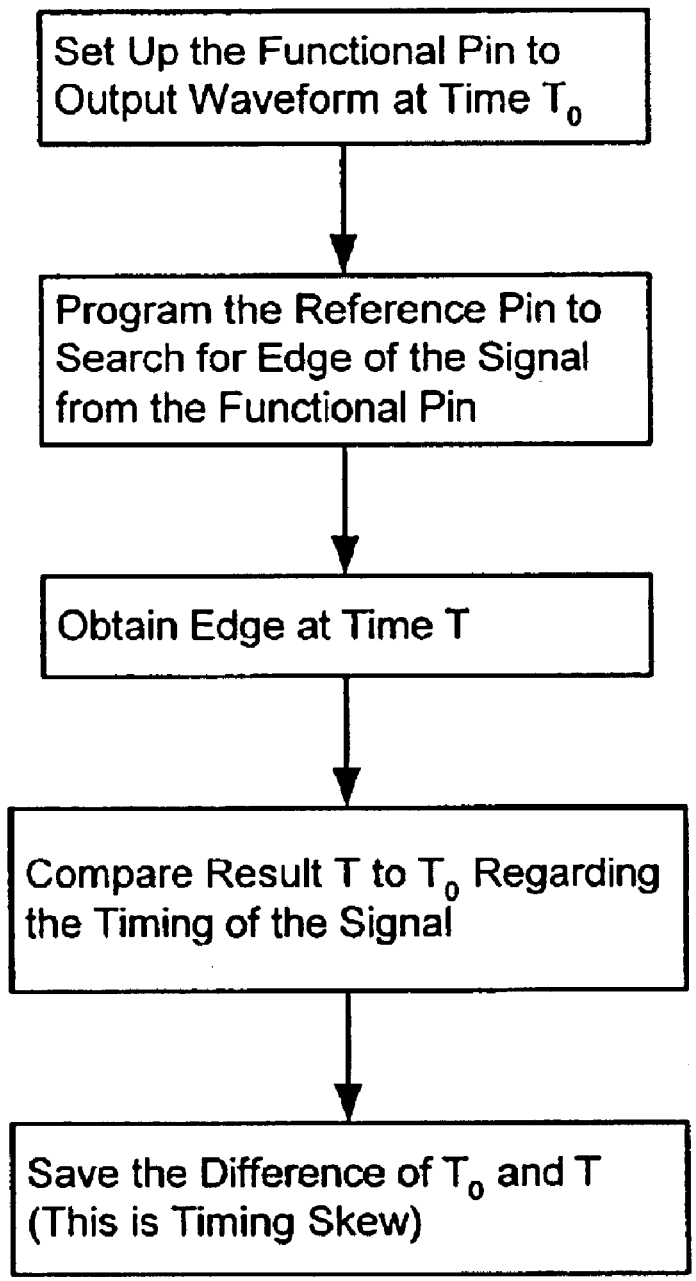
FIG. 11 is an exemplary block diagram describing the measurement of functional pin timing skew according to embodiments of the present invention.

Skew calibration example. FIG. 11 is an exemplary block diagram describing the measurement of functional pin timing skew according to embodiments of the present invention. An example of a skew calibration process according to embodiments of the present invention is described in Tables 3–6. Table 3 describes the skew calibration process. Example skew measurement data is provided in Table 4. In this example, multiple registers are used to store the data on a per-pin basis, and the list of these registers is shown in Table 5. Also, the list of registers used in the tester controller is listed in Table 6.

TABLE 3

Example skew calibration process

| Step # | Description |
|---|---|
| 1 | Find the reference driver time position for strobe event skew calibration |
| a | Go to pin 0. Load strobe high register setup |
| b | Set StrHiSkew to 400Hex |
| c | Search tcRefPhase to find the strobe event skew calibration value, by reading CmpData, bit 3. |
| d | Use the tcRefPhase value from step 1c for all strobe event skew calibration. |
| 2 | Strobe event skew calibration |
| a | Always use the reference driver rising edge. All tester pin comparators are skew calibrated with a single reference driver edge, so that reference driver skew is zero. |
| b | Search the strobe skew registers over the range of 380Hex to 480Hex. (It specifies +/−8 nsec range for this example.) |
| c | Strobe high calibration: end search of StrHiSkew with CmpData bit 3 high. |
| d | Strobe low calibration: end search of StrLoSkew with CmpData bit 4 low. |
| e | Strobe Z (Voh Comp) calibration: end search of StrZskew with CmpData bit 7 high. |
| f | Strobe Z (Voh Comp) calibration: end search of StrZskew with CmpData bit 6 low. |
| g | Take the average of step 2e and step 2f as the strobe Z calibration value. |

TABLE 3-continued

Example skew calibration process

| Step # | Description |
|---|---|
| h | Repeat steps 2c through 2g for all pins. |
| 3 | Driver to comparator TDR (Time Domain Reflectometry) procedure |
| a | Go to pin 0. Load and run the TDR looping test pattern, which is a 96 nsec square wave that strobes high and drives high simultaneously by using clock mode. |
| b | Make sure that StrHighSkew is loaded with calibration data, from step 2. |
| c | Search DrvHighSkew by reading CmpData, bit 3. The search should end with bit 3 high. Write to DrvLowSkew, and write (value + 768) to DrvHighSkew during the search. The number 768 sets the active low pulse width to 48 nsec for clock mode (each count is equal to 62.5 ps). |
| 4 | Find the reference comparator time position for drive event skew calibration |
| a | Load the drive high register setup. |
| b | Use the DrvHighSkew value determined from step 3c. Also load this value into DrvLowSkew. |
| c | Search tcRefPhase to find the drive event skew calibration value, by reading tcRefCmpBits, bit 1. |
| d | Use the tcRefPhase value from step 4c for all drive event skew calibration. |
| 5 | Drive event skew calibration |
| a | Always use only one of the reference comparators, tcRefVoh. All tester pins are calibrated with a single reference comparator, so that reference comparator skew is minimized. |
| b | Search the drive skew registers over the range of 240Hex to 340Hex. (It specifies +/−8 nsec range for this example.) |
| c | Drive high skew calibration |
| d | Drive low skew calibration |
| e | Drive enable skew calibration |
| f | Drive disable skew calibration |
| g | Load enable skew calibration |
| h | Load disable skew calibration |
| i | Repeat steps 5c, 5d, 5e, 5f, 5g, 5h for all pins. |
| 6 | Save skew calibration data |
| a | Save the data. |
| b | This results in strobe event skew calibration values near 400Hex, which is the mid-point of the skew range of 000Hex to 800Hex. |

TABLE 3

Example skew calibration process

| Drive High | Drive Low | Drive Enable | Drive Disable | Load Enable | Load Disable | Strobe High | Strobe Low | Strobe Za | Strobe Zb |
|---|---|---|---|---|---|---|---|---|---|
| 694 | 694 | 666 | 669 | 662 | 663 | 1001 | 1001 | 1001 | 1002 |
| 723 | 724 | 704 | 707 | 700 | 701 | 1032 | 1031 | 1033 | 1031 |
| 707.5 | 707.8 | 687.7 | 690.8 | 684.4 | 684.7 | 1017.7 | 1016.5 | 1017.8 | 1016.7 |

TABLE 4

Example skew measurement data

| Register Mnemonic | Description |
|---|---|
| DrvHighSkew | Drive high skew calibration register |
| DrvLowSkew | Drive low skew calibration register |
| DrvEnabSkew | Drive enable skew calibration register |
| DrvDisSkew | Drive disable skew calibration register |
| LdEnabSkew | Load enable skew calibration register |
| LdDisSkew | Load disable skew calibration register |
| StrHiSkew | Strobe high skew calibration register |
| StrLoSkew | Strobe low skew calibration register |
| StrZskew | Strobe Z skew calibration register |
| CmpData | Comparator data, sample and unsampled |
| | [0] - VOL Comparator live input |
| | [1] - VOH Comparator live input |
| | [2] - Strobe High Flip-Flop for VOL Comparator |
| | [3] - Strobe High Flip-Flop for VOH Comparator |
| | [4] - Strobe Low Flip-Flop for VOL Comparator |
| | [5] - Strobe Low Flip-Flop for VOH Comparator |
| | [6] - Strobe Z Flip-Flop for VOL Comparator |
| | [7] - Strobe Z Flip-Flop for VOH Comparator |
| ClkMode | Special clock mode: two edges from one event |
| EvtInh | Event inhibit: each bit inhibits one of seven actions |
| Vih | Pin driver high voltage, 50 ohm |
| Vil | Pin driver low voltage, 50 ohm |
| Vth | Pin driver VTH diode quad voltage |
| Vix | Pin driver 50 VIX termination voltage, 50 ohm |
| Voh | Pin comparator upper threshold voltage |
| Vol | Pin comparator lower threshold voltage |
| Vkkl | Pin driver high dynamic clamp |
| VkkI | Pin driver low dynamic clamp |
| Ioh | Pin current load, high |
| Iol | Pin current load, low |
| DacCntl | Misc control of octal 13 bit pin electronics DAC |
| RlyCntl | Controls series and shunt tester pin relays |
| DrvCntl | AD53504 pin driver mode control: 8 modes |

TABLE 6

Example registers associated with tester controller for calibration process

| Register Mnemonic | Description |
|---|---|
| tcRefDrvCntl | AD53504 pin driver mode control: 8 modes |
| tcRefDrvEnab | Driver level mask and driver enable |
| tcRefCmpBits | Sampled reference comparator bits |
| | [0] - Vol comparator output |
| | [1] - Voh comparator output |
| tcRefPhaseClr | Reset of 16 bit phase adjustment DAC |
| tcRefPhase | 16 bit phase adjustment DAC for the reference PLL |
| tcRefDacCntl | Misc control of 16 bit phase adjustment DAC |
| tcRefVih | Reference driver high voltage, 50 ohm |
| tcRefVil | Reference driver low voltage, 50 ohm |
| tcRefVth | Reference driver VTH diode quad voltage |
| tcRefVix | Reference driver 50 VIX termination voltage, 50 ohm |
| tcRefVoh | Reference comparator upper threshold voltage |
| tcRefVol | Reference comparator lower threshold voltage |
| tcRefVkkh | Reference driver high dynamic clamp |
| tcRefVkkl | Reference driver low dynamic clamp |

Figure 12:
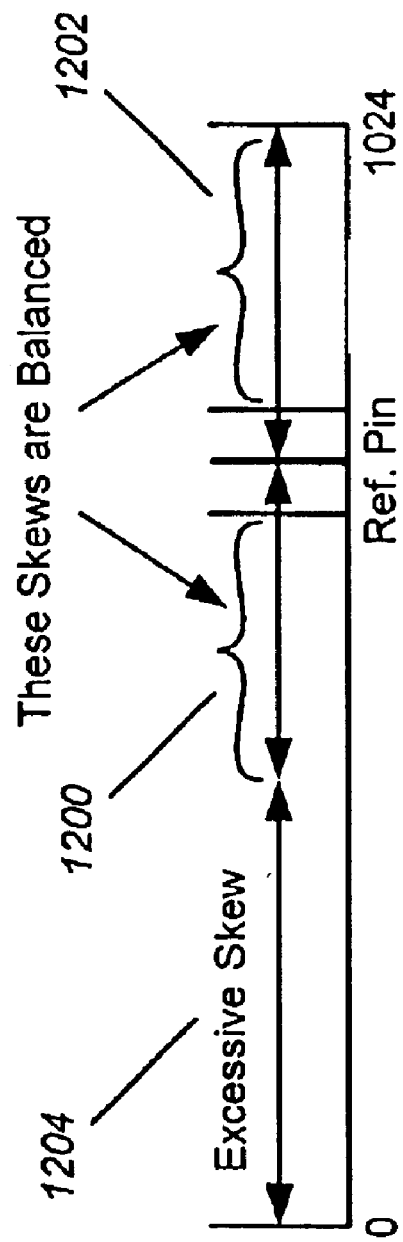
FIG. 12 illustrates an example arbitrary selection of a reference pin according to embodiments of the present invention.

Location of the reference pin. As noted above, one or more functional pins in a test system are designated as reference pins. FIG. 12 illustrates an example arbitrary selection of a reference pin. Timing skews occur due to the change in signal path because of the differences in the distance from each functional pin to the reference pin. If a reference pin is assigned which causes wide variations in functional pin skews, it may be difficult to compensate for those skews. In the example of FIG. 12, functional pins 1200 and 1202 have balanced skews, but other functional pins 1204 may have such dramatically different skews that it will be difficult for the tester to compensate for them. To ensure that skews are balanced among all pins to the greatest extent possible, in embodiments of the present invention the location of the reference pin is selected to be as close as possible to the midpoint of the functional pin range. This midpoint location automatically balances the skew of the functional pins with respect to the reference pin. The location of the reference pin is stored in a designated register. The length of this register is chosen to be large enough to hold the number of binary bits that represent the maximum number of functional pin slots allowed in the test system.

Figure 13A:
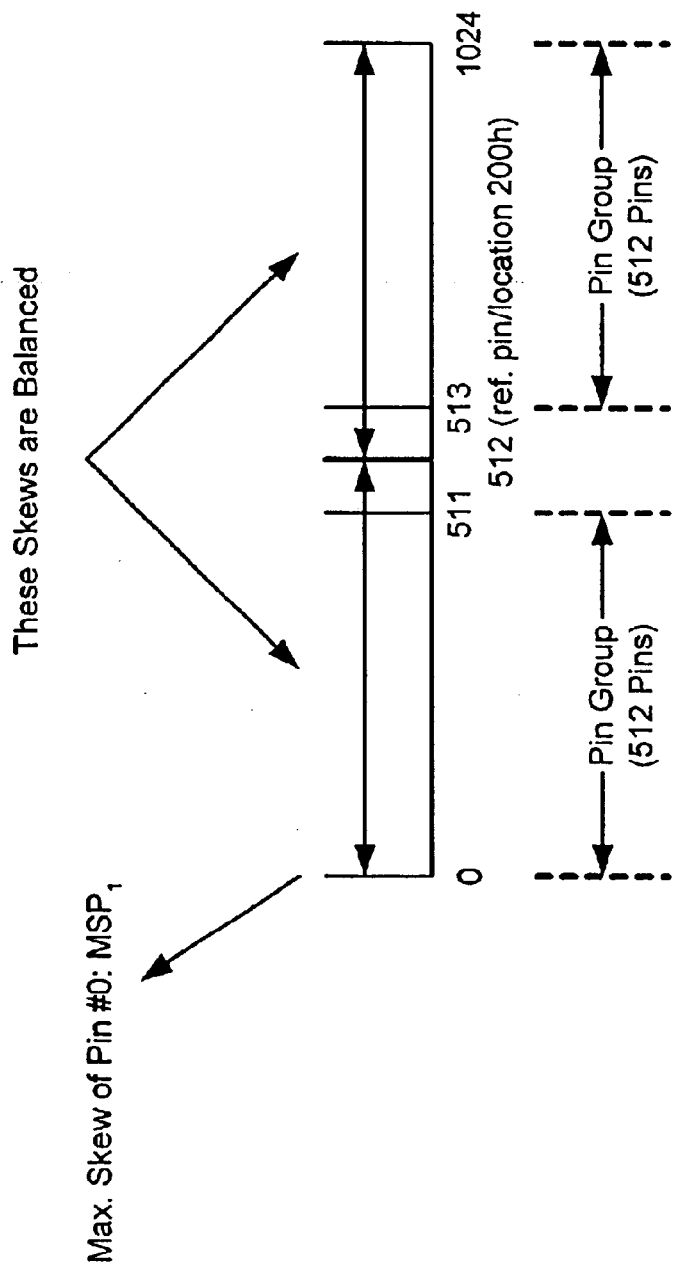
FIG. 13a illustrates an example test system with 1024 functional pins and one reference pin assigned as the midpoint functional pin according to one embodiment of the present invention.

FIG. 13a illustrates an example test system with 1024 functional pins and one reference pin assigned as the midpoint functional pin according to embodiments of the present invention. In the example of FIG. 13a, the functional pins are numbered from 0 to 1024. In this configuration, the reference pin is chosen to be pin 512, the mid-point of all pins. The register for storing the location is programmed as 200h (i.e. 512 decimal, as shown in FIG. 13a). As mentioned above, such a location balances the skews of the functional pins on both sides of the reference pin.

Figure 13B:
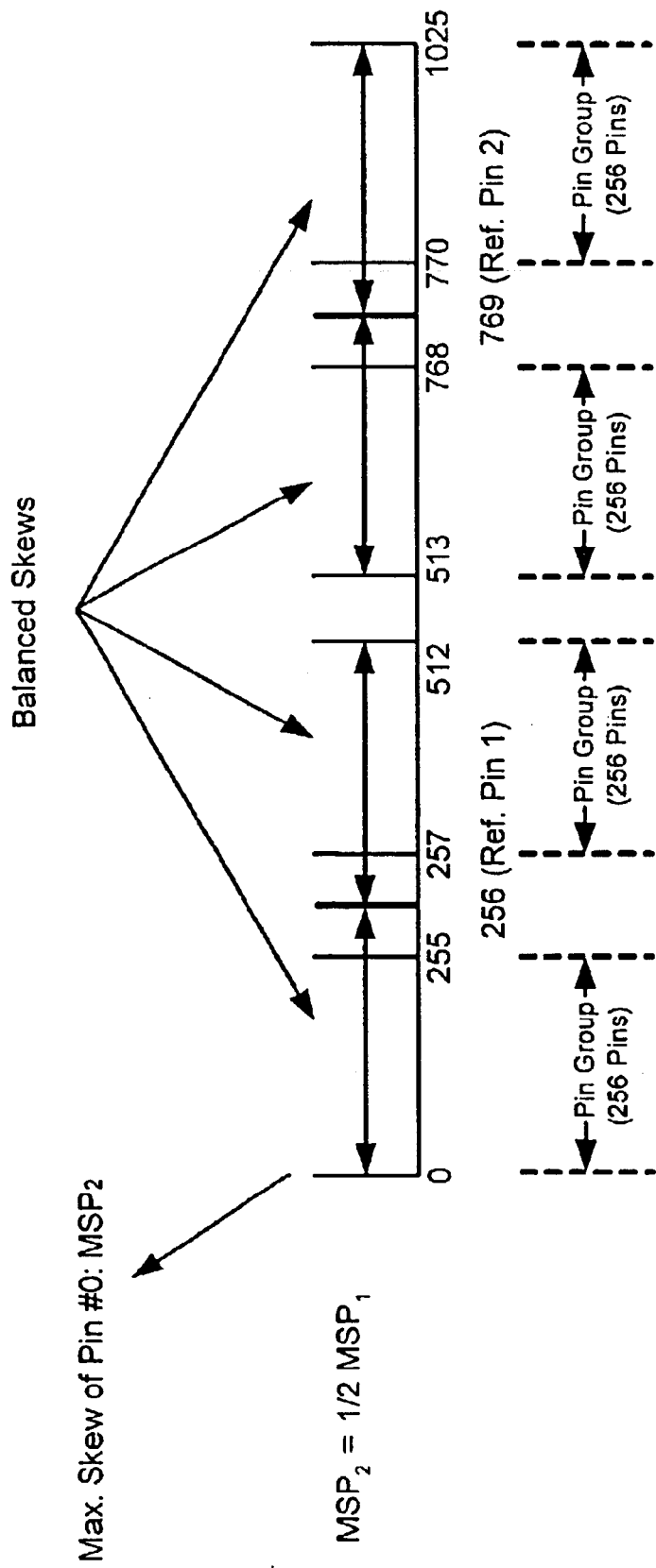
FIG. 13b illustrates an example test system with two reference pins assigned at midpoints within pin group 0–512 (pin 256) and within pin group 513–1025 (pin 769) to reduce the maximum timing skew to half of the maximum skew in FIG. 13a according to one embodiment of the present invention.
Figure 13C:
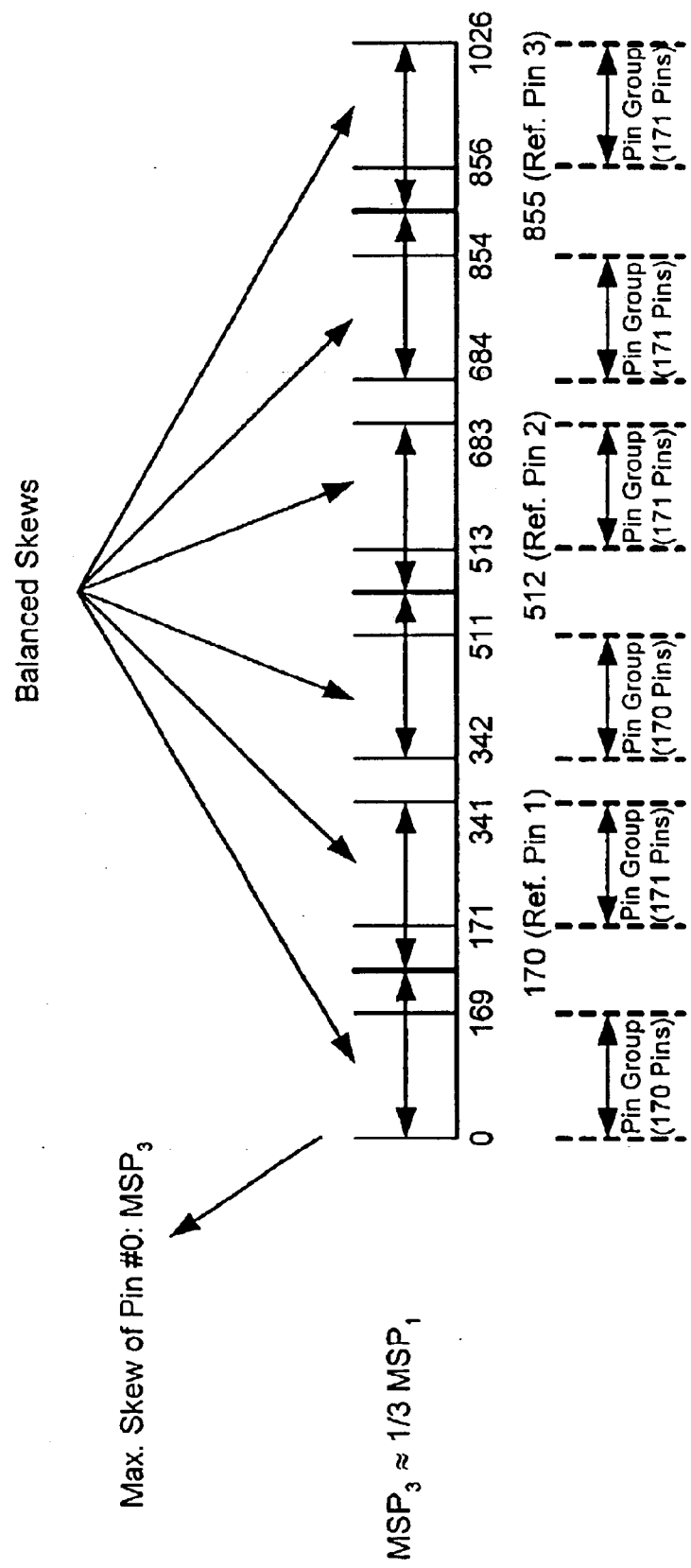
FIG. 13c illustrates an example test system with three reference pins to reduce the maximum timing skew to one-third of the maximum skew in FIG. 13a according to one embodiment of the present invention.

It should be noted that in the above example, the skew between pin 0 or 1024 and the reference pin is considerably higher than the skew between pin 511 or 513 and the reference pin. Even though the reference pin is in a midpoint location, the large difference in skews may nevertheless be difficult to compensate. Therefore, in one embodiment of the present invention, more than one reference pin could be designated to limit the variations in skews. Based on the stored calibration data for the functional pins, the tester controller can determine how many reference pins are needed, and where to assign them. For example, as illustrated in FIG. 13b, by assigning two reference pins at midpoints within pin group 0–512 (pin 256) and within pin group 513–1025 (pin 769), the maximum timing skew can be reduced to half compared to the maximum skew in FIG. 13a. As a further example, if three reference pins are used as illustrated in FIG. 13c, the maximum skew can be reduced to one-third of that in FIG. 13a.

In further embodiments of the present invention, the tester controller can calculate precisely how many reference pins are needed, as well as their locations, to limit the maximum skew in the test system. If the maximum allowable skew is $S_k$, n is the number of pins in a pin group, and the skew between two successive pins is $\tau$, then $n*\tau \leq S_k$, and # of reference pins={Integer of (total # of pins/2n)}+1.

Note that in this method one reference pin is assigned for every two pin groups, located at the common boundary of the two pin groups.

If the location of a reference pin needs to be changed, only the value in the register that holds the location of the reference pins needs to be changed. As all pins have the same characteristics, a new pin becomes the reference pin by virtue of the new value in the register. As an illustration, in the example of FIG. 13a, if the reference pin register value changes from 512 to 256, pin 256 becomes the reference pin. If one value (e.g. 512) is changed to multiple values (e.g. 256 and 768), than the system configuration changes from one reference pin to two reference pins. This method allows dynamic control of the maximum timing skew in the test system. Modification and control of maximum timing skew cannot be achieved by traditional methods.

Storing of measured values. Examples of calibration data that may be stored in the non-volatile memory of the pincard or the test system backplane include, but are not limited to:

(i) compensation of reference driving voltages; (ii) compensation of reference comparison voltages; (iii) compensation of driving current loads; (iv) compensation of parametric measurement circuits connected to the test pins; (v) compensation of timing strobes used to trigger comparisons; and (vi) compensation of timing triggers used to drive test pin stimuli.

In all of the above discussions and examples, registers were used to store measured values, calibration data, the location of the reference pin, and the like. While this method is adequate, it can present a problem when a power interruption occurs, or when a pincard is taken out of the test system for maintenance purpose. Both instances cause a loss of calibration data that is vital for the system operation. When a pincard is removed, calibration data for only that pincard is lost. However, in case of a power interruption, all calibration data is lost including the locations of the reference pins. Hence, a full system calibration including the assignment of reference pins becomes necessary, which is very costly and time consuming.

Figure 14:
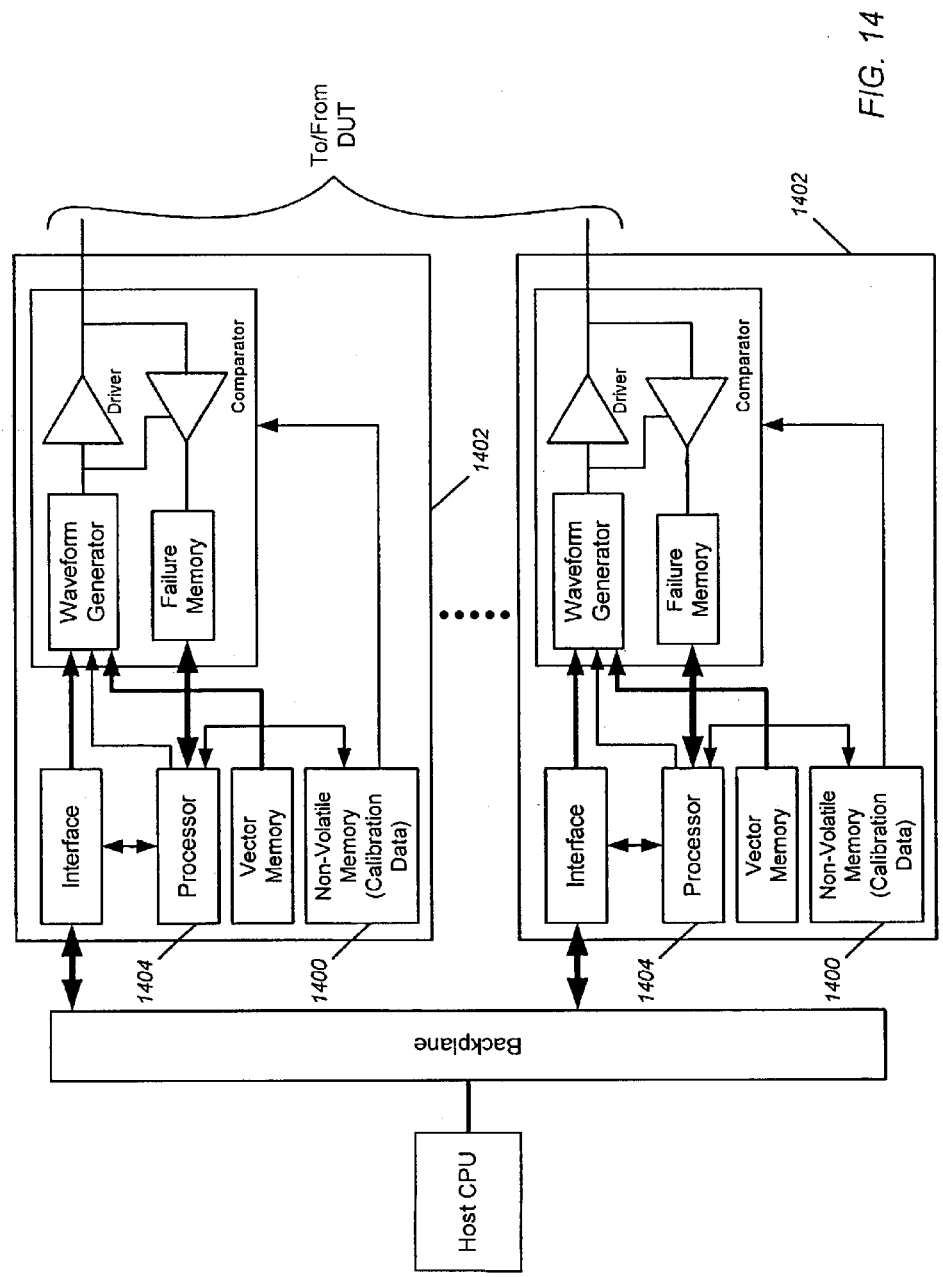
FIG. 14 illustrates example pincards with local nonvolatile memory, such as EEPROM or flash memory, according to embodiments of the present invention.

To overcome this problem, embodiments of the present invention employ nonvolatile memory such as flash memory in each pincard and optionally in the backplane to store the calibration data. The basic concept of pincard design with a local non-volatile memory, such as EEPROM or flash memory, is shown in FIG. 14, and is described in further detail in U.S. utility application Ser. No. 10/340,349 entitled "Semiconductor Test System Storing Pin Calibration Data In Non-Volatile Memory," filed Jan. 10, 2003. This non-volatile memory 1400 resides locally on each pincard 1402, and thus if a pincard is removed from the system or a power interruption occurs, the calibration data is not lost. Alternative embodiments may employ read only memory (ROM) on the pincard, but the use of ROM causes certain restrictions. When a ROM is used on the pincard to store slot-specific loadboard and socket calibration data, use of that pincard will be limited to a fixed slot. In other words, because ROM data cannot be changed, if the ROM stores loadboard and socket calibration data specific to slot A, for example, the pincard can only be used in slot A. If the pincard is plugged into slot B, the ROM calibration data becomes invalid. The use of a RAM (such as DRAM or SRAM) also causes certain restrictions. The use of DRAM or SRAM, as done in existing systems, requires external storage because the contents of a DRAM/SRAM will be lost when a pincard is removed from the test system.

As shown in FIG. 14, each pincard 1402 has a local controller 1404 such as an embedded microprocessor that can read the calibration data from non-volatile memory 1400 and write to specific registers if registers similar to the above examples are used. An internal address/data bus is accessible by either the embedded processor or the external host processor via the pin bus.

Figure 15:
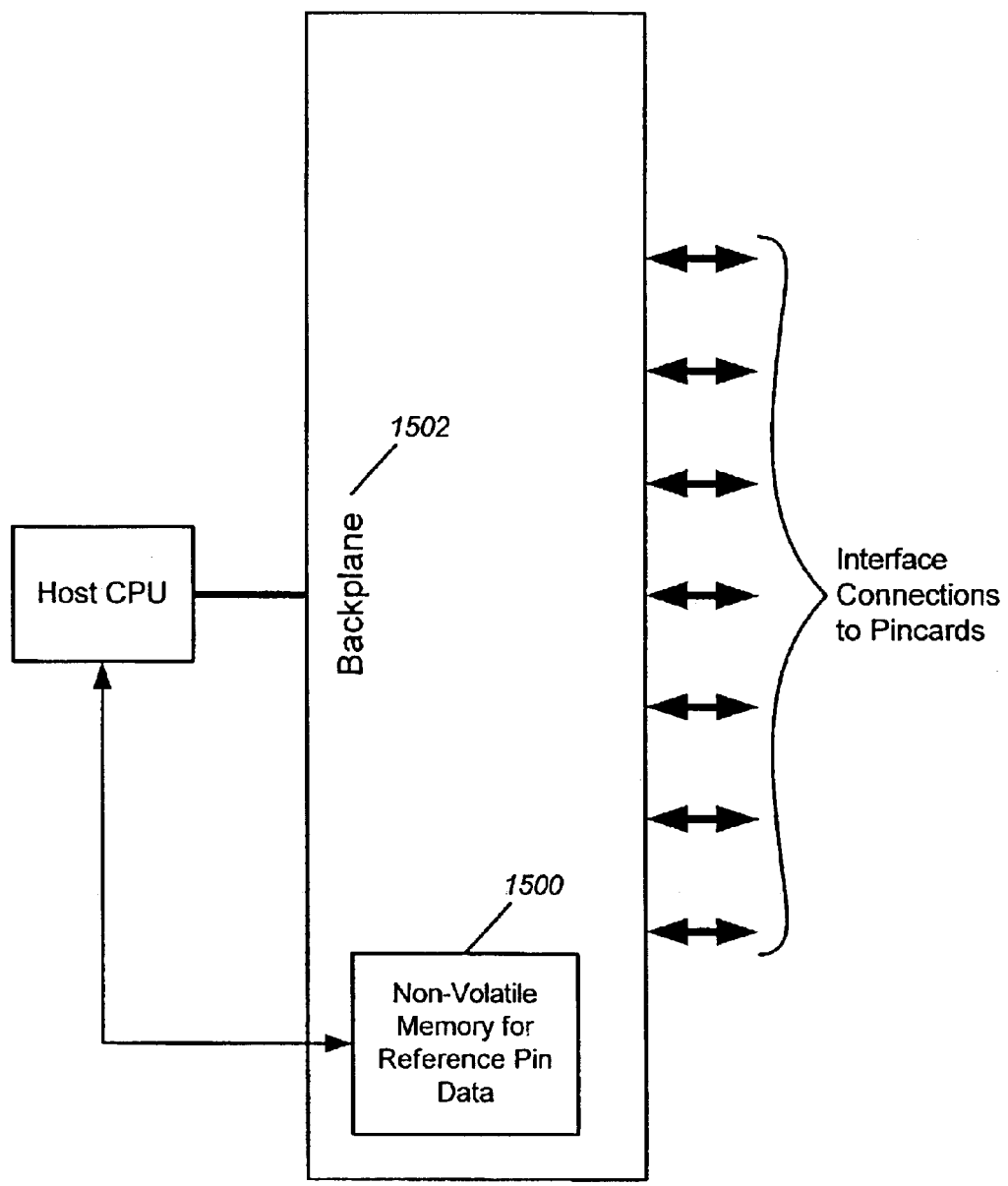
FIG. 15 illustrates an example backplane with a nonvolatile memory for storing the location of the reference pin according to embodiments of the present invention.

It should be noted that in preferred embodiments of the present invention, the location of the reference pin should not be stored and used from pincard non-volatile memory. In embodiments of the present invention, the location of the reference pin is stored in another non-volatile memory 1500 located on the backplane 1502 as shown in FIG. 15.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. In a test system for testing a semiconductor device under test (DUT), the test system having a plurality of functional pins and one or more precision measurement units (PMUs), a method for determining calibration data for the functional pins of the test system, comprising:

assigning one functional pin in the test system as a reference pin (R_PIN) and one PMU as a reference PMU;

taking a particular measurement of the reference pin using external test equipment (R_PIN$_{EXT}$) and the reference PMU (R_PIN$_{PMU}$);

determining a PMU error (PMU_ERR) for the particular measurement by computing R_PIN$_{PMU}$−R_PIN$_{EXT}$; and for every functional pin X to be calibrated,
connecting functional pin X to the reference pin,
taking the particular measurement of functional pin X (F_PIN_X$_{PMU}$) using the reference PMU,
determining a corrected particular measurement of functional pin X (F_PIN_X$_{PMU\_CORR}$) by computing F_PIN_X$_{PMU}$−PMU_ERR, and
determining calibration data for the particular measurement of functional pin X by computing F_PIN_X$_{PMU\_CORR}$−R_PIN$_{EXT}$.

2. The method as recited in claim 1, wherein the particular measurement comprises AC or DC measurements.

3. The method as recited in claim 2, wherein the AC measurement of functional pin X (F_PIN_X$_{PMU}$) is made by the reference PMU by taking and processing multiple DC measurements.

4. In the system as recited in claim 1, each functional pin including one driver and at least one comparator, the method as recited in claim 1, wherein the step of connecting functional pin X to the reference pin further comprises:

connecting the driver of functional pin X to the at least one comparator of the reference pin; and
connecting the at least one comparator of functional pin X to the driver of the reference pin.

5. The method as recited in claim 4, wherein the particular measurement of functional pin X (F_PIN_X$_{PMU}$) voltages is made using the at least one comparator of the reference pin instead of the reference PMU.

6. The method as recited in claim 1, further comprising:

organizing two or more of the plurality of functional pins into a pin group;
connecting the functional pins in the pin group to the DUT;
taking an uncalibrated measurement of a particular measurement type for each functional pin in the pin group using the reference PMU; and
performing a group write to calibrate the uncalibrated measurements by modifying the uncalibrated measurements using calibration data for the particular measurement type and storing the calibrated measurements in one bus cycle.

7. The method as recited in claim 6, further comprising:

assigning an update flag for each measurement type for each functional pin in the pin group;
setting the update flags associated with a particular measurement type when a group write for that measurement type is initiated;
resetting the update flag for a particular measurement type and functional pin when a group write has been completed for that particular measurement type on that particular functional pin; and terminating the group write only after all set update flags have been reset.

8. The method as recited in claim 1, further comprising selecting a location of the reference pin such that timing skews between the reference pin and the plurality of functional pins is balanced.

9. The method as recited in claim 8, further comprising storing the location of the reference pin in a reference pin register large enough to uniquely identify the location of the reference pin from among the plurality of functional pins.

10. The method as recited in claim 9, further comprising:
minimizing the timing skews between the reference pin and the plurality of functional pins by designating multiple functional pins as a reference pins; and
storing the location of each reference pin in the reference pin register.

11. The method as recited in claim 10, the test system having n functional pins in each of a plurality of pin groups and a skew τ between two successive pins, the method further comprising:
automatically calculating how many reference pins are needed in order to limit a maximum skew $S_k$ in the test system, wherein $n*\tau \leq S_k$, by computing {integer of (total # of pins/2n)}+1; and
automatically assigning the functional pin at the boundary of two adjacent pin groups as a reference pin.

12. The method as recited in claim 1, further comprising selecting a location of the reference pin to be approximately at a midpoint of a range of the plurality of functional pins.

13. The method as recited in claim 1, the test system having a plurality of pincards, each pincard containing a plurality of functional pins, the method further comprising storing the calibration data for the functional pins on each pincard in non-volatile memory on that pincard.

14. The method as recited in claim 13, wherein the calibration data stored in non-volatile memory on each pincard is addressable by a local pincard controller.

15. The method as recited in claim 13, wherein the calibration data stored in non-volatile memory on each pincard is addressable and formatted by either a local pincard controller or a tester controller.

16. The method as recited in claim 1, further comprising storing the calibration data per functional pin as a gain value and an offset value.

17. In a test system for testing a semiconductor device under test (DUT), the test system having a plurality of functional tester pins and one or more precision measurement units (PMUs), a method for taking an internal measurement of the functional tester pins of the test system, comprising:
assigning one functional tester pin in the test system as a reference tester pin and one PMU as a reference PMU;
for every functional tester pin to be measured,
connecting the functional tester pin to the reference tester pin, and
taking the internal measurement of functional tester pin using the reference PMU.

18. In the system as recited in claim 17, each functional tester pin including one driver and at least one comparator, the method as recited in claim 17, wherein the step of connecting the functional tester pin to the reference tester pin further comprises:
connecting the driver of the functional tester pin to the at least one comparator of the reference tester pin; and
connecting the at least one comparator of the functional tester pin to the driver of the reference tester pin.

19. A test apparatus capable of being calibrated for testing a semiconductor device under test (DUT), comprising:
a backplane;
a plurality of pincards coupled through the backplane, each pincard containing a plurality of functional pins and one or more precision measurement units (PMUs);
one functional pin in the test apparatus assigned as a reference pin (R_PIN) capable of being measured using external test equipment or the one or more PMUs;
one PMU in the test apparatus assigned as a reference PMU for measuring the reference pin and the plurality of functional pins; and
a tester controller coupled to the plurality of pincards through the backplane, the tester controller programmed for determining calibration data for the functional pins of the test apparatus by
storing a particular measurement of the reference pin using external test equipment (R_PIN$_{EXT}$) and the reference PMU (R_PIN$_{PMU}$),
determining a PMU error (PMU_ERR) for the particular measurement by computing R_PIN$_{PMU}$–R_PIN$_{EXT}$, and
for every functional pin X to be calibrated,
connecting functional pin X to the reference pin,
taking the particular measurement of functional pin X (F_PIN_X$_{PMU}$) using the reference PMU,
determining a corrected particular measurement of functional pin X (F_PIN_X$_{PMU\_CORR}$) by computing F_PIN_X$_{PMU}$–PMU_ERR, and
determining calibration data for the particular measurement of functional pin X by computing F_PIN_X$_{PMU\_CORR}$–R_PIN$_{EXT}$.

20. The test apparatus as recited in claim 19, wherein the particular measurement comprises AC or DC measurements.

21. The test apparatus as recited in claim 20, the tester controller further programmed for making the AC measurement of functional pin X (F_PIN_X$_{PMU}$) by using the reference PMU to take and process multiple DC measurements.

22. The test apparatus as recited in claim 19, further comprising:
one driver and at least one comparator within each functional pin; and
the tester controller further programmed for connecting functional pin X to the reference pin by
connecting the driver of functional pin X to the at least one comparator of the reference pin, and
connecting the at least one comparator of functional pin X to the driver of the reference pin.

23. The test apparatus as recited in claim 22, the tester controller further programmed for making the particular measurement of functional pin X (F_PIN_X$_{PMU}$) voltages using the at least one comparator of the reference pin instead of the reference PMU.

24. The test apparatus as recited in claim 19, two or more of the plurality of functional pins organized into a pin group, the tester controller further programmed for:
connecting the functional pins in the pin group to the DUT;
taking an uncalibrated measurement of a particular measurement type for each functional pin in the pin group using the reference PMU; and
performing a group write to calibrate the uncalibrated measurements by modifying the uncalibrated measurements using calibration data for the particular measurement type and storing the calibrated measurements in one bus cycle.

25. The test apparatus as recited in claim 24, the tester controller further programmed for:
assigning an update flag for each measurement type for each functional pin in the pin group;
setting the update flags associated with a particular measurement type when a group write for that measurement type is initiated;
resetting the update flag for a particular measurement type and functional pin when a group write has been completed for that particular measurement type on that particular functional pin; and
terminating the group write only after all set update flags have been reset.

26. The test apparatus as recited in claim 19, the tester controller further programmed for selecting a location of the reference pin such that timing skews between the reference pin and the plurality of functional pins is balanced.

27. The test apparatus as recited in claim 26, the tester controller further programmed for storing the location of the reference pin in a reference pin register large enough to uniquely identify the location of the reference pin from among the plurality of functional pins.

28. The test apparatus as recited in claim 27 the tester controller further programmed for:
minimizing the timing skews between the reference pin and the plurality of functional pins by designating multiple functional pins as a reference pins; and
storing the location of each reference pin in the reference pin register.

29. The test apparatus as recited in claim 28, the plurality of functional pins organized as n functional pins in each of a plurality of pin groups with a skew $\tau$ between two successive pins, the tester controller further programmed for:
automatically calculating how many reference pins are needed in order to limit a maximum skew $S_k$ in the test system, wherein $n*\tau \leq S_k$, by computing {integer of (total # of pins/2n)}+1; and
automatically assigning the functional pin at the boundary of two adjacent pin groups as a reference pin.

30. The test apparatus as recited in claim 19, the tester controller further programmed for selecting a location of the reference pin to be approximately at a midpoint of a range of the plurality of functional pins.

31. The test apparatus as recited in claim 19, the tester controller further programmed for storing the calibration data for the functional pins on each pincard in non-volatile memory on that pincard.

32. The test apparatus as recited in claim 31, wherein the calibration data stored in non-volatile memory on each pincard is addressable by a local pincard controller.

33. The test apparatus as recited in claim 31, wherein the calibration data stored in non-volatile memory on each pincard is addressable and formatted by either a local pincard controller or a tester controller.

34. The method as recited in claim 19, the tester controller further programmed for storing the calibration data per functional pin as a gain value and an offset value.

35. A test apparatus for testing a semiconductor device under test (DUT) and for taking an internal measurement of a functional pin within the test apparatus, comprising:
a backplane;
a plurality of pincards coupled through the backplane, each pincard containing a plurality of functional pins and one or more precision measurement units (PMUs);
one functional pin in the test apparatus assigned as a reference pin;
one PMU in the test apparatus assigned as a reference PMU for measuring the plurality of functional pins; and
a tester controller coupled to the plurality of pincards through the backplane, the tester controller programmed for taking an internal measurement of a functional pin within the test apparatus by
connecting the functional pin to the reference pin, and
taking the internal measurement of the functional pin using the reference PMU.

36. The test apparatus as recited in claim 35, further comprising:
one driver and at least one comparator within each functional pin; and
the tester controller further programmed for connecting the functional pin to the reference pin by
connecting the driver of functional pin to the at least one comparator of the reference pin, and
connecting the at least one comparator of the functional pin to the driver of the reference pin.

* * * * *